United States Patent [19]
Blanchard

[11] Patent Number: 5,960,277
[45] Date of Patent: Sep. 28, 1999

[54] METHOD OF MAKING A MERGED DEVICE WITH ALIGNED TRENCH FET AND BURIED EMITTER PATTERNS

[75] Inventor: Richard A. Blanchard, Los Altos, Calif.

[73] Assignee: STMicroelectronics, Inc., Carrollton, Tex.

[21] Appl. No.: 08/868,525

[22] Filed: Jun. 4, 1997

Related U.S. Application Data

[60] Division of application No. 08/472,337, Jun. 7, 1995, Pat. No. 5,710,443, which is a continuation-in-part of application No. 08/397,710, Feb. 28, 1995, Pat. No. 5,591,655.

[51] Int. Cl.[6] ........................... H01L 21/00; H01L 21/84; H01L 21/336
[52] U.S. Cl. .......................... 438/234; 438/156; 438/270
[58] Field of Search ..................... 257/328–332, 257/378; 438/268, 270, 272, 156, 234

[56] References Cited

U.S. PATENT DOCUMENTS

| | | | |
|---|---|---|---|
| 4,487,639 | 12/1984 | Lam et al. ................. | 148/175 |
| 4,868,626 | 9/1989 | Nakazato et al. . | |
| 4,881,119 | 11/1989 | Paxman et al. . | |
| 4,893,160 | 1/1990 | Blanchard ............... | 357/23.4 |
| 4,935,799 | 6/1990 | Mori et al. . | |
| 5,118,635 | 6/1992 | Frisina ..................... | 437/31 |
| 5,247,200 | 9/1993 | Momose et al. . | |
| 5,304,821 | 4/1994 | Hagino .................... | 257/139 |
| 5,380,670 | 1/1995 | Hagino .................. | 148/DIG. 126 |
| 5,410,170 | 4/1995 | Bulucea et al. ......... | 257/330 |
| 5,424,231 | 6/1995 | Yang .......................... | 437/6 |
| 5,471,075 | 11/1995 | Shekar et al. ........... | 257/139 |

OTHER PUBLICATIONS

Blanchard, "A Power Transistor With an Integrated Thermal Feedback Mechanism," Massachusetts Institute of Technology (1970). No Month.

Tukune, et al., "Spontaneous Polysilicon and Epitaxial Silicon Deposition," J. Electrochem. Soc., vol. 142, No. 5 (1995). No Month.

Primary Examiner—Brian Dutton
Attorney, Agent, or Firm—Theodore E. Galanthay; Lisa K. Jorgenson; Andre M. Szuwalski

[57] ABSTRACT

A merged power device structure, of the emitter-switching type, in which the emitter of the bipolar power transistor has a minimum-width pattern which is aligned to the trenches of a trench control transistor. Thus the current density of the bipolar is maximized, since the emitter edge length per unit area is increased. The parasitic base resistance of the bipolar can also be reduced.

24 Claims, 2 Drawing Sheets

METHOD OF MAKING A MERGED DEVICE WITH ALIGNED TRENCH FET AND BURIED EMITTER PATTERNS

This application is a divisional application of U.S. application Ser. No. 08/472,337, filed on Jun. 7, 1995 and issued as U.S. Pat. No. 5,710,443 on Jan. 20, 1998, which is a continuation-in-part application of U.S. application Ser. No. 08/397,710, filed on Feb. 28, 1995 and now U.S. Pat. No. 5,591,655 issued Jan. 7, 1997.

BACKGROUND AND SUMMARY OF THE INVENTION

The present invention relates to power semiconductor device structures for high-voltage and/or high-power operating conditions.

Emitter switching is a circuit configuration in which a low-voltage power transistor (typically an MOS transistor) cuts off the emitter current of a high-voltage bipolar transistor whose base is connected to a fixed potential. Thus the bipolar's $V_{BE}$ is controlled by varying the emitter potential in order to switch the bipolar on and off.

An example of this configuration, shown in FIG. 4, is a switched-emitter transistor structure according to commonly-owned U.S. Pat. No. 5,065,213. This U.S. Pat. No. 5,065,213, which is hereby incorporated by reference, is a pioneering disclosure of switched-emitter device structures. In the primary embodiment described in this patent, a power bipolar transistor is overlaid with a VDMOS power device. The VDMOS device is a vertical-current-flow field-effect transistor which is easily switched by an insulated gate at its surface. The drain of the VDMOS device is a buried layer which ALSO functions as the emitter of a power bipolar device. Thus the on or off state of the VDMOS changes the potential of the bipolar device's emitter (hence the name of the device). The base of the bipolar device is another buried layer (surrounding and deeper than the emitter layer), which is held at constant potential. When the VDMOS is turned on, its conduction pulls up the drain/emitter diffusion. This forward biases the base/emitter junction to turn on the bipolar. Once the bipolar is turned on it provides a lower on-resistance per unit area than would a MOS transistor of the same breakdown voltage (due to bipolar conduction and associated regeneration gain). Thus this structure provides a uniquely advantageous improvement in the tradeoff between on-resistance Ron and breakdown voltage Vmax.

Switched-emitter configurations offer several advantages:
 the negative temperature coefficient of a unipolar control transistor helps protect the bipolar transistor against reverse secondary breakdown (RSBOA);
 the merged device combines the current and voltage carrying capacity of a bipolar transistor and the high speed of a low-voltage transistor;
 the merged device can be piloted directly with linear logic circuits, through the MOS gate.

The parent application proposed use of a trench FET as the control device in a switched-emitter structure. Trench FETs are particularly well-suited to this, since they provide high current density, though without the high-voltage stand-off capabilities of VDMOS devices. (A VDMOS device may itself be analyzed as a composite device, i.e. a lateral DMOS device in series with a vertical JFET, which is gated by the fixed potential of the deep-body diffusion of the VDMOS. A trench FET is not a composite device in this sense.)

The present application provides a new switched emitter structure in which the emitter of the bipolar power transistor is patterned (preferably in a substantially minimum-width pattern), in a pattern which is aligned to the trenches of a trench control transistor. Thus the current density of the bipolar is maximized, since the emitter edge length per unit area is increased.

The intrinsic base width is defined by the combined doping of the buried n-type and p-type buried layers. A further advantage of the innovative merged structure is that, since large parts of the P-type buried layer are not overlain by the n+ buried layer, the extrinsic base resistance of the power bipolar is reduced (and can be further reduced, without significantly changing the characteristics of the intrinsic base, by increasing the doping per unit area of both buried layers). Thus this structure permits the parasitic resistance of both emitter and base to be reduced.

The reduced parasitic resistance of the base further implies that the bipolar gain can be specified at a fairly low value (to increase ruggedness), without an excessive voltage drop in the base (which might lead to emitter-base junction debiasing). The reduced parasitic resistance of the extrinsic base also facilitates fast turn-off and avoidance of "hot-spotting". (Non-uniform turn-off of a power transistor, especially when connected to an inductive load, can produce regions of transiently increased current density.)

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
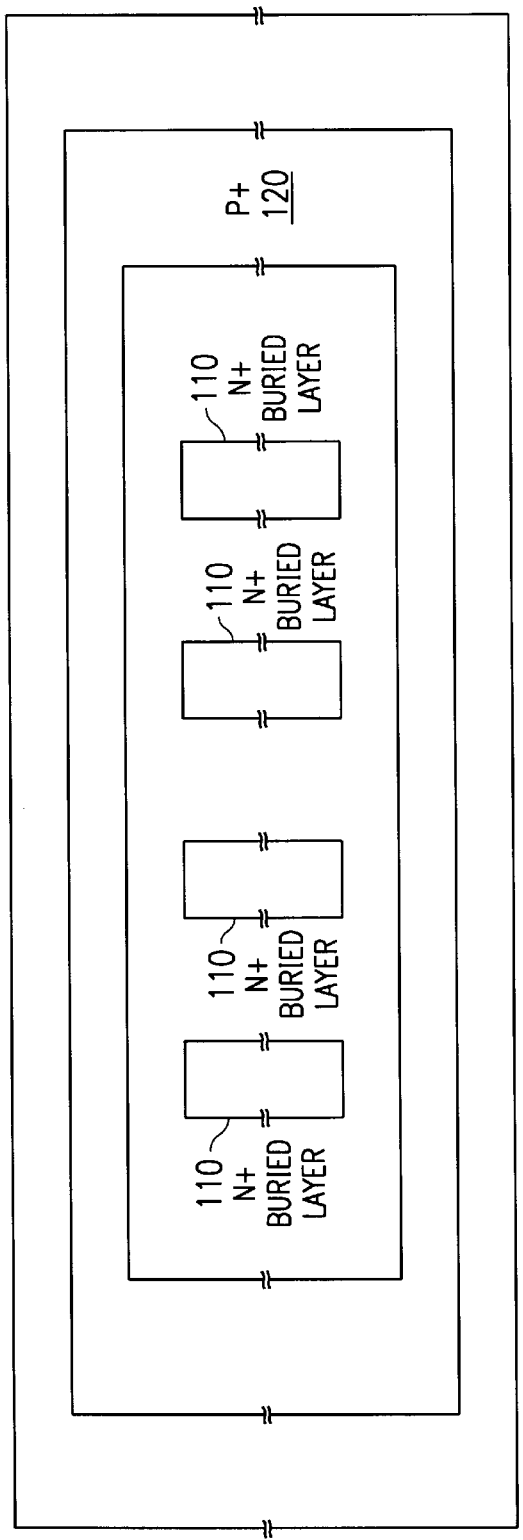
FIG. 1 shows a plan view of the bipolar portion of a switched-emitter transistor structure according to a sample embodiment of the present invention.
Figure 2:
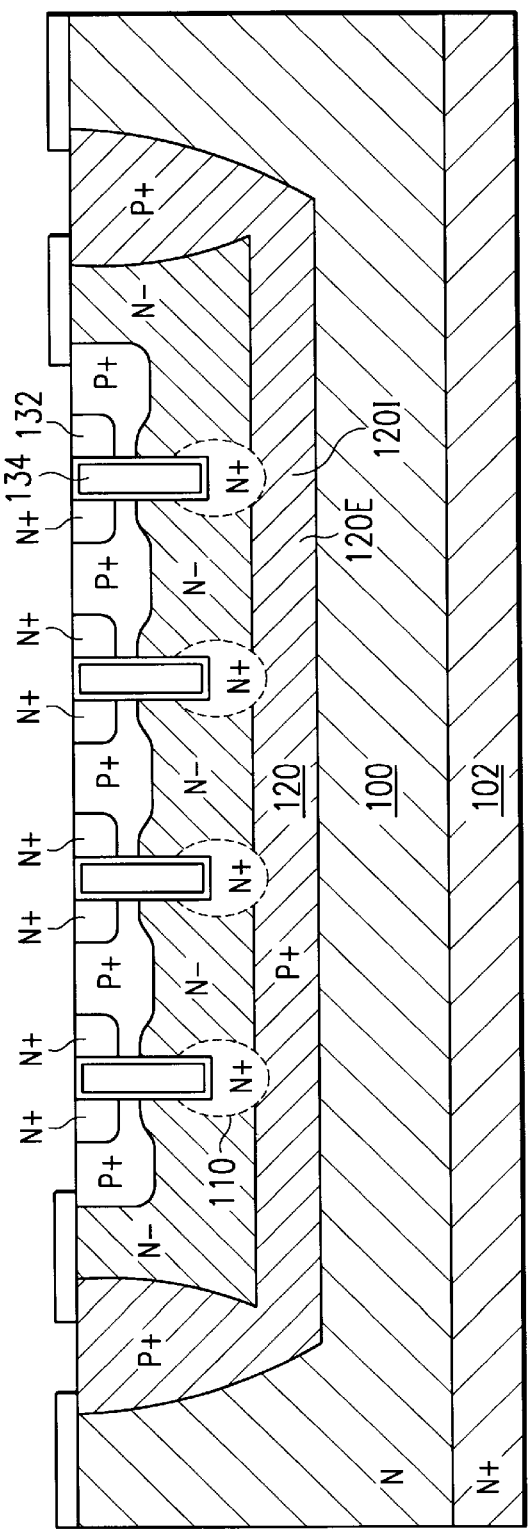
FIG. 2 is a sectional view of a switched-emitter transistor structure according to the present invention.

The numerous innovative teachings of the present application will be described with particular reference to the presently preferred embodiment (by way of example, and not of limitation), in which:

FIG. 1 shows a plan view of the bipolar portion of a switched-emitter transistor structure according to a sample embodiment of the present invention, and FIG. 2 is a sectional view of a switched-emitter transistor structure according to the present invention.

The n+ emitter portions 110, in the presently preferred embodiment, have a pitch in the range of 10–15 $\mu$m and a minimum width of e.g. 3–4 $\mu$m. (The width is less than half the pitch in order to avoid current crowding between adjacent emitters.) The pitch, in the presently preferred embodiment, is limited by the n+ pitch rather than the trench pitch. (Minimum geometries for buried layers are typically larger than those of overlying structures.)

The dopant density (Q) for the buried layers is typically in the range of 5E14–5E16 cm$^{-2}$ for each (specifically e.g. $5 \times 10^{15}$ cm$^{-2}$ for the P-type and $2 \times 10^{16}$ cm$^{-2}$ for the N-type). Many bipolar structures use a heavier doping for the N-type buried layer (and this may be preferable in some implementations of the disclosed structure), but this is not strictly necessary for the practice of the present invention (emitter injection efficiency is not particularly a concern). The P-type doping density is preferably selected to provide a low sheet resistance in the extrinsic base 120E while retaining base width control; the N-type dopant density is preferably selected to provide counterdoping of the P-type dopants, and to provide a heavier doping on the emitter side of the emitter/base junction.

Boron is preferred for the p-type buried layer 120. (The greater diffusivity of boron, as opposed to gallium, would provide greater counterdoping, hence a greater ratio of extrinsic base width to intrinsic base width.) A slow diffusing dopant (As or Sb) is preferred for the n-type buried layer, but phosphorus can also be used.

The length of the channel 110 of the trench FET, in the presently preferred embodiment, is selected to withstand only a moderate voltage (e.g. about 20 V, which implies a channel length of about 0.5 to 1 $\mu$m with typical epitaxial layer doping levels. The epitaxial layer thickness can accordingly be e.g. 5 to 10 microns.

The source 132 is shallow and doped N+.

The gate 134 of the trench FET is, e.g., N+ polysilicon.

A clamp diode is preferably used to protect the switched-emitter structure when inductive loads must be driven.

The minimum intrinsic base thickness in this type of structure is selected in accordance with the desired gain and ruggedness, but is typically in the range of 1–4 $\mu$m. Larger base widths imply lower gain but greater ruggedness.

The bipolar transistor is preferably a fairly low-gain device, e.g. beta of 20–100. (The beta is controlled by selecting the base width; lower base widths produce higher gain, but transistors with lower beta are typically more rugged.)

Typical operating voltages on this structure may be, e.g., 3 V constant base voltage (optionally fed through a load impedance); 0 V source voltage on the control device; gate voltage switched between e.g. 0 V and e.g. 10 V; collector voltage 500 V. Of course a wide variety of different operating voltages can be specified, with or without modifications to optimize the device structure, but this example will help to illustrate the advantages of the disclosed structure.

Figure 3:
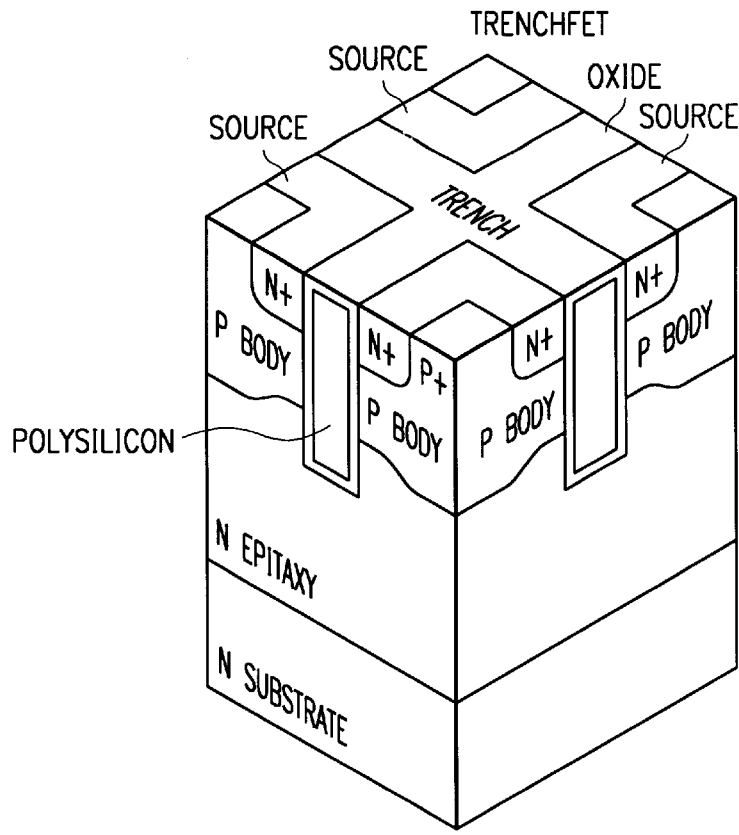
FIG. 3 is a detailed view of the trench MOS transistor in the structure of FIG. 2.

FIG. 3 is a detailed view of a sample implementation of a trench MOS transistor for use in the structure of FIG. 2. Details of this implementation are known in the art, such as described in Goodenough, "Trench-Gate DMOS FETs In SO-8 Switch 10A at 30 V," in the Mar. 6, 1995 issue of *Electronic Design* at 65. (Of course many other implementations are possible; see e.g. U.S. Pat. Nos. 4,893,160 and 4,914,058, both of which are hereby incorporated by reference.)

Figure 4:
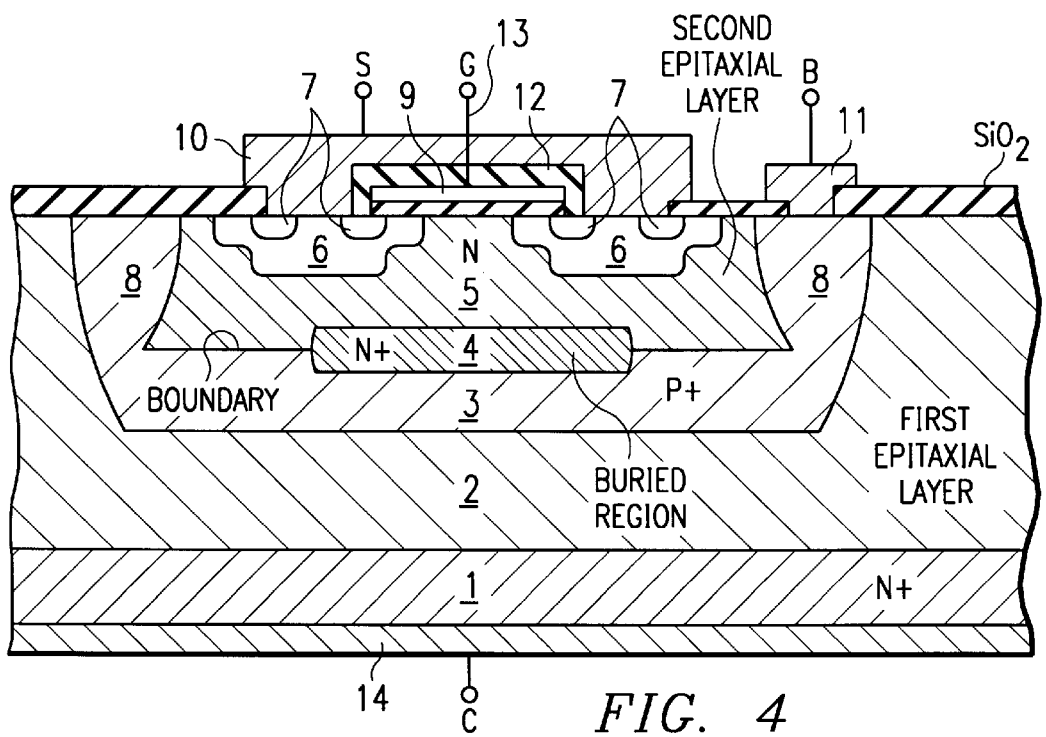
FIG. 4 shows an existing switched-emitter transistor structure according to commonly-owned U.S. Pat. No. 5,065,213.

FIG. 4 shows a final structure, as taught in U.S. Pat. No. 5,065,213, as it appears after addition of the terminals C (collector), B (base), S (source) and G (gate) and the insulating layer 12 of the gate 9 (said gate being connected to the relative terminal by means of the insulated conductor 13). Regions 1, 2, 3 and 4 of the figure constitute, respectively, the collector, the base and the emitter of a bipolar transistor, while region 5 constitutes the drain of the MOS.

The emitter 4 represents a completely buried N+ type active region; by growing a second N type epitaxial layer 5 it is thus possible to connect the drain of the MOS to the emitter 4 of the bipolar transistor.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

One contemplated alternative embodiment forms the buried emitter without an N-type buried layer, by using an implant into the trench bottom. This embodiment is less preferred, since the required control processing is more difficult (principally because the use of a trench-bottom implant risks base-width variation due to variation in trench depth). However, various processing modifications can be used to address this risk, e.g. using differential implants into the trench bottom.

For another example, various termination structures can be used in combination with the primary illustrated structures. For example, additional trench transistors can be used at the edge, without the full corresponding patterned N-type buried layer, to provide a structure analogous to a buried field plate.

What is claimed is:

1. A method of fabricating a merged device structure, comprising the steps of:

providing a substrate of substantially monolithic semiconductor material of a first conductivity type;

creating a first buried layer of a second conductivity type in said substrate, said first buried layer forming a bipolar transistor base portion;

creating a second buried layer of said first conductivity type over said first buried layer, said second buried layer having multiple separate spaced apart portions, wherein said first buried layer extends between adjacent portions of said second buried layer portions, said second buried layer portions forming bipolar transistor emitter portions;

growing an epitaxial layer of said first conductivity type on said substrate;

etching a plurality of trenches into said epitaxial layer, in a pattern which is substantially aligned to said portions of said second buried layer;

forming insulated gates in said trenches, and forming first-conductivity-type source regions proximally to a top of said trenches, said insulated gates and source regions forming field effect transistor portions having vertical current flow; and forming second-conductivity-type diffusions to provide surface contact to said first buried layer.

2. The method of claim 1, wherein said semiconductor material consists of silicon.

3. The method of claim 1, wherein said first buried layer has a dopant concentration per unit area which is greater than $5 \times 10^{15}$ cm$^{-2}$.

4. The method of claim 1, wherein said second buried layer has a dopant concentration per unlit area which is greater than $1 \times 10^{16}$ cm$^{-2}$.

5. The method of claim 1, wherein portions of said first buried layer beneath said second buried layer have a width in the range of 1–4 microns.

6. The method of claim 1, wherein said first conductivity type is N-type.

7. The method of claim 1, wherein the pitch of the second buried layer portions is approximately twice the width thereof.

8. The method of claim 1, wherein the second buried layer portions are minimum geometry second buried layer portions.

9. The method of claim 1, wherein the second buried layer has a dopant density of approximately $5 \times 10^{15}$ cm$^{-2}$.

10. The method of claim 1, wherein the substrate forms a bipolar transistor collector portion.

11. A method of forming a switched-emitter merged device structure, said method comprising the steps of:

forming a plurality of field-effect control transistor portions each including a source region of a first conductivity type at a first surface of a substantially monocrystalline semiconductor material, and a gate connected to control the flow of carriers of the first conductivity type from the source region through a channel region downwardly into the semiconductor material; and forming a plurality of power bipolar transistor portions including emitter diffusions of the first conductivity type overlying a portion of a single base diffusion of a second conductivity type;

wherein the emitter diffusions include a first buried layer having multiple separate spaced apart emitter diffusion portions on the order of a respective control transistor portion, and the single base diffusion includes a second buried layer which extends between and connects with adjacent emitter diffusion portions of the first buried layer; and wherein individual ones of the emitter diffusion portions of the bipolar transistor portions are aligned to respective corresponding ones of the control transistor portions for providing an increased emitter diffusion length per unit area.

12. The method of claim 11, wherein the second buried layer has a dopant concentration per unit area which is greater than $5 \times 10^{15}$ cm$^{-2}$.

13. The method of claim 11, wherein the second buried layer has a dopant concentration per unit area which is greater than $1 \times 10^{16}$ cm$^{-2}$.

14. The method of claim 11, wherein a bipolar transistor formed by the power bipolar transistor portions has a beta of less than 50.

15. The method of claim 11, wherein the second buried layer includes an emitter dopant concentration, in proximity to the base diffusion, which is less than three times the dopant concentration of the base diffusion in proximity to the emitter diffusion.

16. The method of claim 11, wherein portions of the second buried layer beneath the first layer have a width in the range of 1–4 microns.

17. The method of claim 11, wherein the first conductivity type is N-type.

18. A method of forming a switched-emitter merged device structure, said method comprising the steps of:

forming a plurality of field-effect trench transistor portions each including a source region of a first conductivity type at a first surface of a substantially monocrystalline semiconductor material, and an insulated gate connected to control the flow of carriers of the first conductivity type from the source region through a second-conductivity-type channel region along the wall of the trench downwardly into the semiconductor material; and forming a plurality of power bipolar transistor portions including emitter diffusions of the first conductivity type overlying a portion of a single base diffusion of a second conductivity type;

wherein the emitter diffusions include a first buried layer having multiple separate spaced apart emitter diffusion portions on the order of a respective trench transistor portion, and the single base diffusion includes a second buried layer which extends between and connects with adjacent emitter diffusion portions of the first buried layer; and wherein the emitter diffusion portions are aligned in a pattern which corresponds to the pattern of the trenches for providing an increased emitter diffusion length per unit area.

19. The method of claim 18, wherein the second buried layer has a dopant concentration per unit area which is greater than $5 \times 10^{15}$ cm$^{-2}$.

20. The method of claim 18, wherein the second buried layer has a dopant concentration per unit area which is greater than $1 \times 10^{16}$ cm$^{-2}$.

21. The method of claim 18, wherein a bipolar transistor formed by the bipolar transistor portions has a beta of less than 50.

22. The method of claim 18, wherein the second buried layer includes an emitter dopant concentration, in proximity to the base diffusion, which is less than three times the dopant concentration of the base diffusion in proximity to the emitter diffusion.

23. The method of claim 18, wherein portions of the second buried layer beneath the first layer have a width in the range of 1–4 microns.

24. The method of claim 18, wherein the first conductivity type is N-type.

\* \* \* \* \*